(12) United States Patent
Kim

(10) Patent No.: US 11,637,045 B2
(45) Date of Patent: Apr. 25, 2023

(54) ANISOTROPIC CONDUCTIVE FILM (ACF) FOR USE IN TESTING SEMICONDUCTOR PACKAGES

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 939 days.

(21) Appl. No.: 16/261,278

(22) Filed: Jan. 29, 2019

(65) Prior Publication Data

US 2020/0243405 A1 Jul. 30, 2020

(51) Int. Cl.
| | |
|---|---|
| *H01L 23/48* | (2006.01) |
| *H01L 25/18* | (2006.01) |
| *H01L 25/00* | (2006.01) |
| *H01L 23/00* | (2006.01) |
| *H01L 21/66* | (2006.01) |
| *H01L 25/065* | (2023.01) |
| *G01R 31/28* | (2006.01) |

(52) U.S. Cl.
CPC .......... *H01L 22/32* (2013.01); *G01R 31/2884* (2013.01); *H01L 22/12* (2013.01); *H01L 24/48* (2013.01); *H01L 25/0657* (2013.01); *H01L 25/50* (2013.01); *H01L 2224/48227* (2013.01); *H01L 2225/06506* (2013.01); *H01L 2225/06562* (2013.01); *H01L 2225/06586* (2013.01); *H01L 2225/06596* (2013.01)

(58) Field of Classification Search
CPC .......... H01L 2224/48227; H01L 22/32; H01L 2225/06596; H01L 24/09
See application file for complete search history.

(56) References Cited

U.S. PATENT DOCUMENTS

| | | | | |
|---|---|---|---|---|
| 5,994,766 | A | * 11/1999 | Shenoy | ................. H01L 23/528 257/664 |
| 2012/0292091 | A1 | * 11/2012 | Han | .................... G01R 31/2818 174/262 |
| 2019/0122943 | A1 | * 4/2019 | Lim | ..................... H01L 23/4985 |
| 2020/0212009 | A1 | * 7/2020 | Xu | ........................... H01L 22/34 |
| 2020/0235018 | A1 | * 7/2020 | Kim | ......................... H01L 24/73 |
| 2021/0243896 | A1 | * 8/2021 | Schmidt | ............... G01R 1/0441 |

* cited by examiner

*Primary Examiner* — Anthony Ho
*Assistant Examiner* — David J Goodwin
(74) *Attorney, Agent, or Firm* — Schwabe, Williamson & Wyatt, P.C.

(57) ABSTRACT

Embodiments described herein provide an anisotropic conductive film (ACF) positioned on a semiconductor package and techniques of using the ACF to test semiconductor devices positioned in or on the semiconductor package. In one example, a semiconductor package comprises: a die stack comprising one or more dies; a molding compound encapsulating the die stack; a substrate on the molding compound; a contact pad on a surface of the substrate and coupled to the die stack; a test pad on the surface of the substrate; a conductive path between the contact pad and the test pad, where an electrical break is positioned along the conductive path; and an ACF over the electrical break. Compressing the ACF by a test pin creates an electrical path that replaces the electrical break. Data can be acquired by test pin and provided to a test apparatus, which determines whether the dies in the die stack are operating properly.

18 Claims, 10 Drawing Sheets

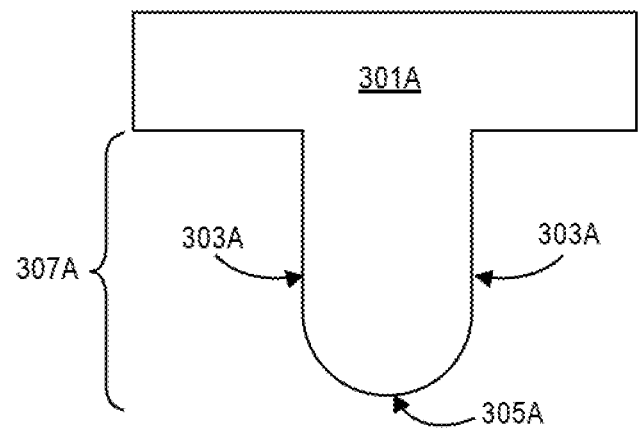
FIG. 3A
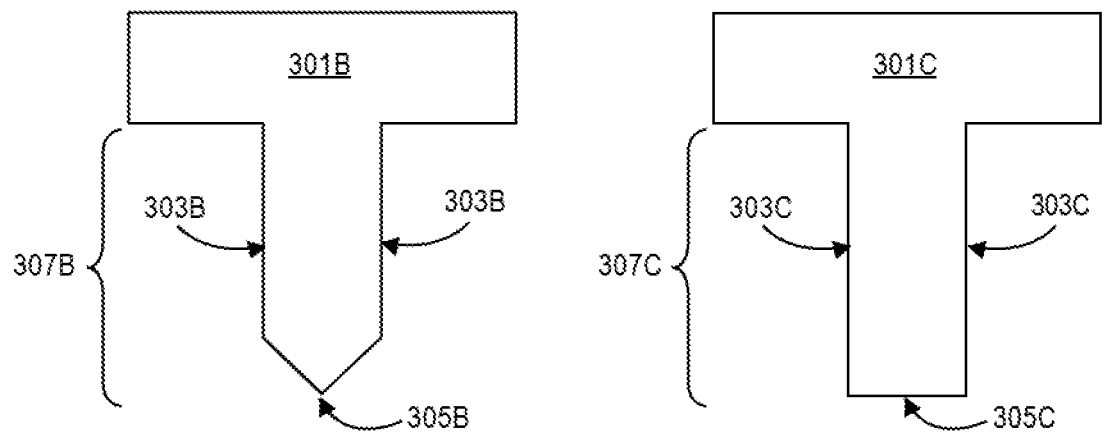
FIG. 3B  FIG. 3C

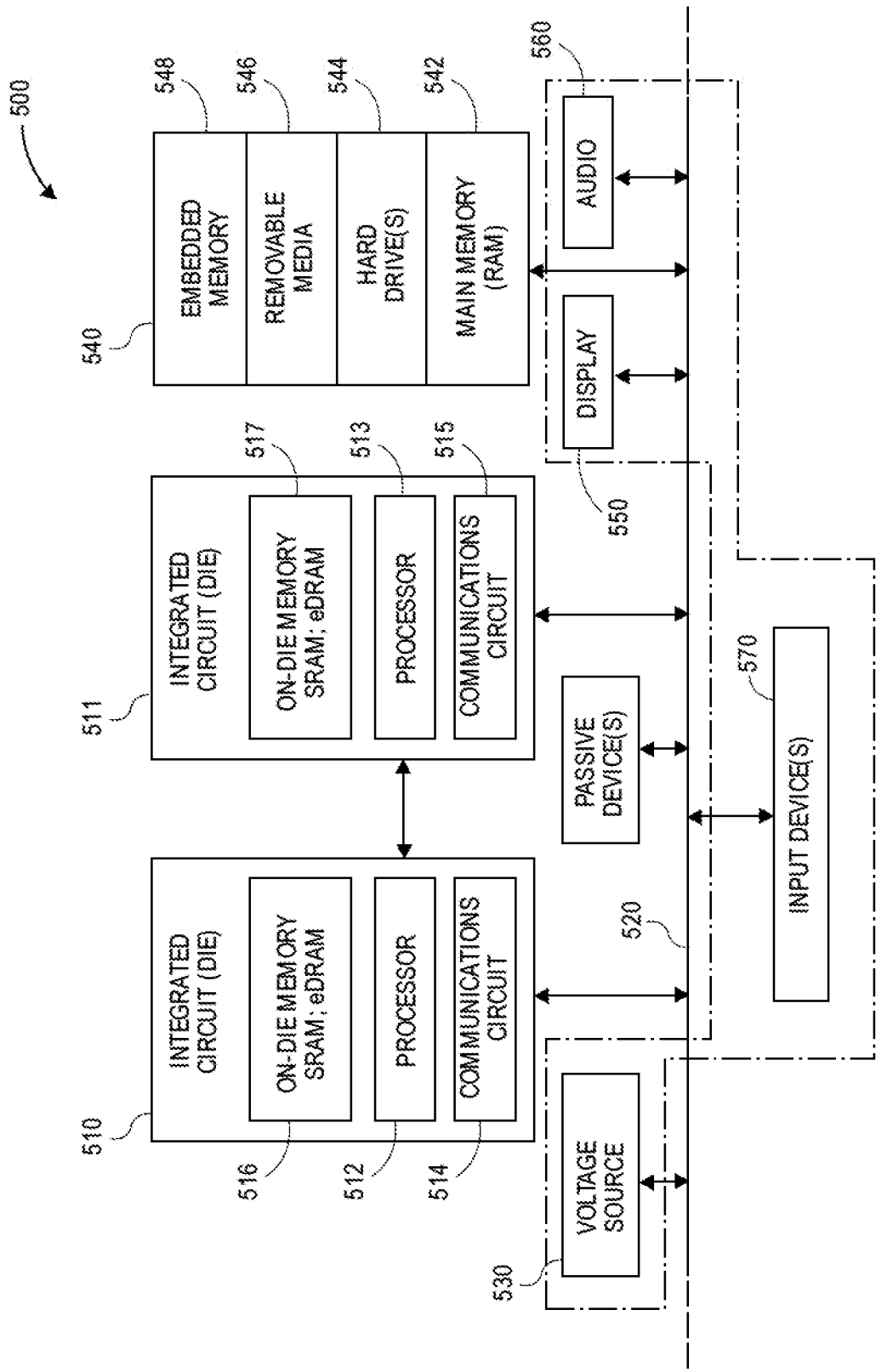

US 11,637,045 B2

ANISOTROPIC CONDUCTIVE FILM (ACF) FOR USE IN TESTING SEMICONDUCTOR PACKAGES

BACKGROUND

Field

Embodiments described herein generally relate to semiconductor packaging. More particularly, but not exclusively, embodiments described herein relate to an anisotropic conductive film (ACF) for use in testing a semiconductor package.

Background Information

A semiconductor package generally includes one or more contact pads coupled to devices (e.g., one or more dies, inductors, capacitors, etc.) within or on the semiconductor package. The contact pad(s) may be formed in or on the semiconductor package for propagation of electrical signals (e.g., high speed signals, etc.).

To ensure proper operation of a semiconductor package, its connections, and its devices, the contact pads formed in or on the semiconductor package can be tested. A test socket is one example of a device that can be used for such testing. A test socket includes test pins used for contacting contact pads on the semiconductor package. When the test socket's test pins are in contact with the contact pads, a voltage is applied via the test pin. The voltage causes current to flow from the contact pads to the devices formed in or on the semiconductor package. Data can then be acquired by the test apparatus, via the test pins, to determine proper operation of the semiconductor package's devices (e.g., one or more dies coupled to the contact pads, etc.).

Despite the benefits of test sockets, currently available test sockets cannot support testing of contact pads that have fine or ultra-fine pitches (e.g., pitches that are less than 0.3 millimeters (mm), etc.). In order to test such contact pads, strip- or wafer-level probe technologies are employed. Strip- or wafer-level probe technologies require forming test pads on a substrate near contact pads. In one scenario, the test pads—which usually have pitches that are 0.3 mm or more—are fanned out from the contact pads having fine or ultra-fine pitches. In this scenario, traces are used to couple the fanned-out test pads to the contact pads.

There are drawbacks associated with strip- and wafer-level testing techniques. One drawback is that testing of a semiconductor package having contact pads with fine or ultra-fine pitches using fanned-out test pads may be marred with signal integrity issues. This is because the test signals are propagated over long traces (e.g., traces greater than 3.00 mm in length) that couple the fanned-out test pads to the contact pads.

Another drawback is that strip- and wafer-level testing techniques are costly and imprecise. This is because these testing techniques are inadequate for testing singulated semiconductor packages. The inability to detect such manufacturing defects at the unit level potentially reduces the yield associated with semiconductor packaging and manufacturing techniques, which in turn makes these testing techniques imprecise and costly.

One more drawback is that the electrical connections between the contact pads and the fanned-out test pads must be removed—e.g., via laser cutting, via mechanical sawing, etc.—from a semiconductor package following testing in order to avoid signal interference issues that could negatively affect the proper operation of the semiconductor package. For example, if the test pads are left coupled to the devices of the semiconductor package, the test pads and traces coupled to the test pads function as antennae that can induce unwanted interference during the operation of a semiconductor package. However, this removal process is tedious, imprecise, and costly, which in turn reduces the yield and reliability of semiconductor packages.

The drawbacks discussed above reduce the yield of semiconductor packaging and manufacturing techniques. Thus, testing of semiconductor packages remains suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 3A-3D are a cross sectional side view illustrations of test pins, according to several embodiments.

FIG. 5 is schematic illustration of a computer system, according to one embodiment.

DETAILED DESCRIPTION

Figure 1A:
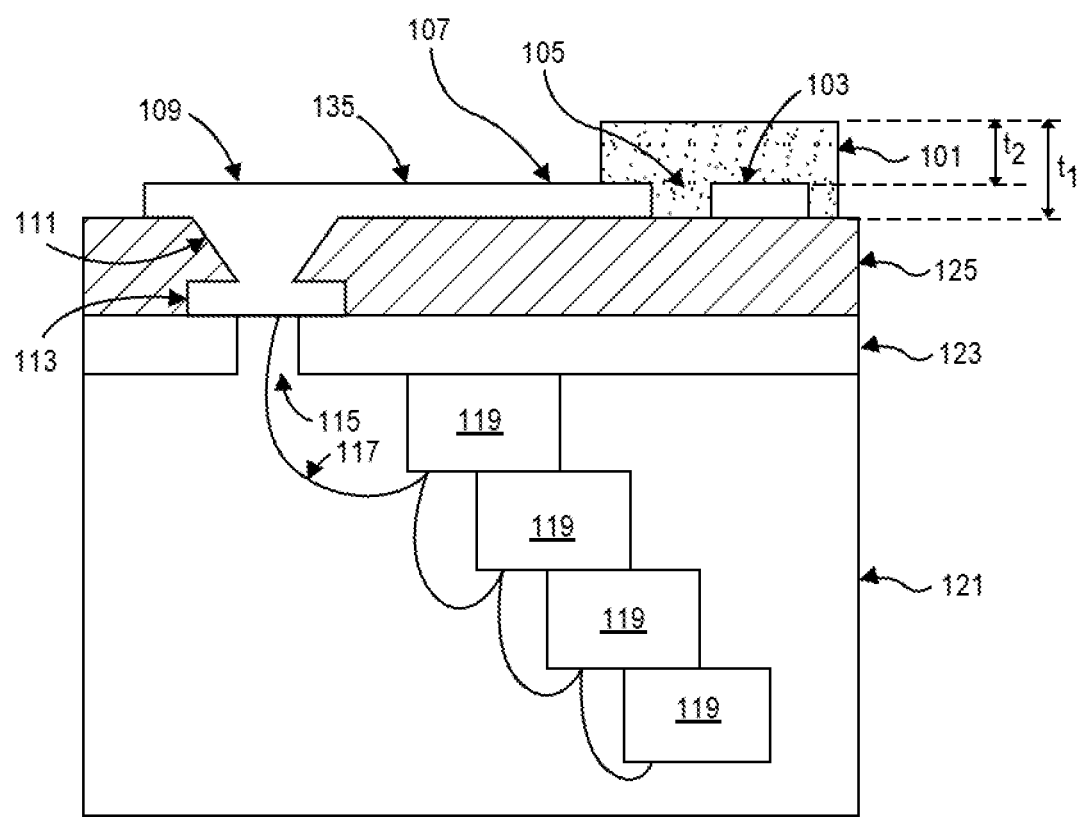
FIG. 1A is a cross sectional side view illustration of a semiconductor package comprising an anisotropic conductive film (ACF) over an electrical break positioned between a test pad and a bond finger, according to one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein are directed to a semiconductor package that includes an anisotropic conductive film (ACF) positioned over an electrical break in a conductive path on the semiconductor package. In one embodiment, the conductive path is between a contact pad positioned on a substrate of the semiconductor package and a test pad positioned on the substrate. In a more specific embodiment, the electrical break is between the test pad and a bond finger that is closer to the test pad than the contact pad. In this embodiment, a trace couples the bond finger to the contact pad and the bond finger terminates at the electrical break between the bond finger and the test pad. In this embodiment, the ACF is over the test pad and at least one portion of the bond finger. In one embodiment, the ACF is used during testing of one or more devices (e.g., one or more dies, etc.) positioned in or on the semiconductor package. More specifically, the ACF is compressed with a test pin of a test socket, which applies a voltage to the test pad through the ACF. Due to the compression, the conductive materials in the ACF: (i) form an electrical path that bridges the electrical break in the conductive path; and (ii) enable current (caused by the applied voltage) to flow from the test pad through the contact pad to the one or more devices positioned in or on the semiconductor package. The test pin can then acquire data from the test pad and provide the data to a test apparatus coupled to the test socket. In this way, the one or more devices positioned in or on the semiconductor package can be tested.

Several advantages accrue from the embodiments described herein. One advantage is that the ACF does not have to be removed from the semiconductor package following testing, which in turn does away with the need to use complex and costly removal processes (e.g., laser cutting, mechanical sawing, etc.) to decouple the contact pad from the test pad. The ACF does not have to be removed because the electrical break between the contact pad and the test pad is restored when the ACF is no longer compressed. Another advantage is that, unlike the long traces used in currently available strip- and wafer-level testing techniques, at least one embodiment described herein requires the trace that couples the bond finger to the contact pad to have a maximum length of 3.0 millimeters. This maximum length can assist with reducing or eliminating signal integrity issues that plague the long traces used in currently available strip- and wafer-level testing techniques. One more advantage is that electrical breaks that remain after testing prevent the test pad from functioning as an antenna that introduces unwanted interference during the operation of the semiconductor package. For yet another advantage, the ACF can be used for testing semiconductor packages to detect manufacturing defects that cannot be detected by strip- and wafer-level testing techniques. Another advantage is that the ACF acts as a buffer or protective layer that prevents the test pin from contacting the semiconductor package directly. As a result, the test pin is prevented from damaging the semiconductor package (e.g., the test pad, etc.).

FIG. 1A is a cross sectional side view illustration of a semiconductor package comprising an anisotropic conductive film (ACF) 101 over an electrical break 105 positioned between a test pad 103 and a bond finger 107, according to one embodiment. Several portions, components, or devices formed in or on the semiconductor package shown in FIG. 1A have been omitted to avoid obscuring or convoluting the embodiments described herein.

The semiconductor package shown in FIG. 1A includes a die stack comprising dies 119. The semiconductor package shown in FIG. 1A may include one or more dies. For illustrative purposes, the semiconductor package shown in FIG. 1A includes four dies 119.

The semiconductor package shown in FIG. 1A includes a molding compound 121 encapsulating the dies 119. Furthermore, the semiconductor package includes a solder resist layer 123 positioned on the dies 119 and the molding compound 121. The solder resist layer 123 includes a solder resist opening (SRO) 115. Additionally, the semiconductor package includes a substrate 125 positioned on the solder resist layer 123. Furthermore, the semiconductor package includes: (i) a pad 113 in the substrate 125, where the pad 113 is coupled via an interconnection 117 (e.g., a wire, etc.) to the dies 119; a vertical interconnect access (via) 111 in the substrate 125, where the via 111 is coupled to the pad 113; and (iii) a contact pad 109 on a surface of the substrate 125, where the via 111 is coupled to the contact pad 109. In short, the contact pad 109 is coupled to the dies 119 through the interconnection 117, the pad 113, and the via 111. The semiconductor package shown in FIG. 1A also includes a test pad 103, a bond finger 107, and a trace 135 on a surface of the substrate 125, where the trace 135 couples the bond finger 107 and contact pad 109 to each other. The test pad 103 comprises a top surface, a bottom surface in contact with the substrate 125, and sidewall surfaces coupling the top surface of the test pad 103 to the bottom surface of the test pad 103. Furthermore, and as shown in FIG. 1A, the ACF 101 is over the first surface and sidewall surfaces of the test pad 103. In some embodiments, at least one portion of the ACF 101 is on the substrate 125. In some embodiments, at least one portion of the ACF 101 is on at least one portion of the bond finger 107.

As shown in FIG. 1A, a conductive path between the contact pad 109 and the test pad 103 comprises the trace 135, the bond finger 107, and an electrical break 105. As used herein, a "conductive path" between two components or devices refers a path between the two components or devices that comprises at least one conductive structure, where the conductive structure electrically couples the two components or devices to each other and where the conductive structure is formed from a conductive material (e.g., copper, any other suitable conductive material known in the art, or any combination of suitable conductive materials known in the art). For example, a conductive path between two pads may comprise a trace. For another example, a conductive path between two pads may comprise a vertical interconnect access (via). For yet another example, a conductive path between a first pad and a die may comprise a trace, a second pad, a via, and a wire. The conductive path may be a continuous path with no electrical breaks in the path. Alternatively, the conductive path may be a noncontinuous path with at least one electrical break along the path. For example, an electrical break along a conductive path may result in the ends of the electrical path, on opposite sides of the electrical break, being electrically decoupled from each other.

With regard again to FIG. 1A, the conductive path between the contact pad 109 and the test pad 103 is noncontinuous. The electrical break 105 prevents the contact pad 109 and the test pad 103 from being electrically coupled to each other. More specifically, the electrical break 105 is positioned between the bond finger 107 and the test pad 103 in some embodiments.

In one embodiment, an anisotropic conductive film (ACF) 101 may be positioned over the electrical break 105. The ACF 101 acts as a bridge between the bond finger 107 and the test pad 103. The ACF 101 is formed from anisotropic materials (e.g., a dielectric material having conductive particles therein, etc.). The ACF 101 remains insulating when it is not compressed, as shown in FIG. 1A. That is, in an uncompressed state, the conductive particles of the ACF 101 are electrically isolated from each other by the dielectric material of the ACF 101, and current does not flow through the ACF 101. However, when a portion of the ACF 101 is compressed (as described in connection with FIGS. 1B-1D), conductive particles in the compressed region of the ACF 101 are squeezed together to create an electrical path through the ACF 101. Portions of the ACF 101 that are not compressed remain insulated from the electrical connection by the dielectric material. As a film, the ACF 101 may be applied by lamination: (i) over, onto, or in the electrical break 105; (ii) over or onto the test pad 103; and (iii) over or onto at least portion of the bond finger 107. In one embodiment, the ACF 101 has a thickness $t_1$ that is measured from a top surface of the substrate 125 to a top surface of the ACF 101. Other embodiments, however, are not so limited. For example, and as shown in FIG. 1A, the ACF 101 can have a thickness $t_2$ that is measured from a top surface of the test pad 103 to a top surface of the ACF 101. In one embodiment, one or more of the thicknesses $t_1$ and $t_2$ ranges from 5 micrometers (μm) to 100 μm.

Figure 1B:
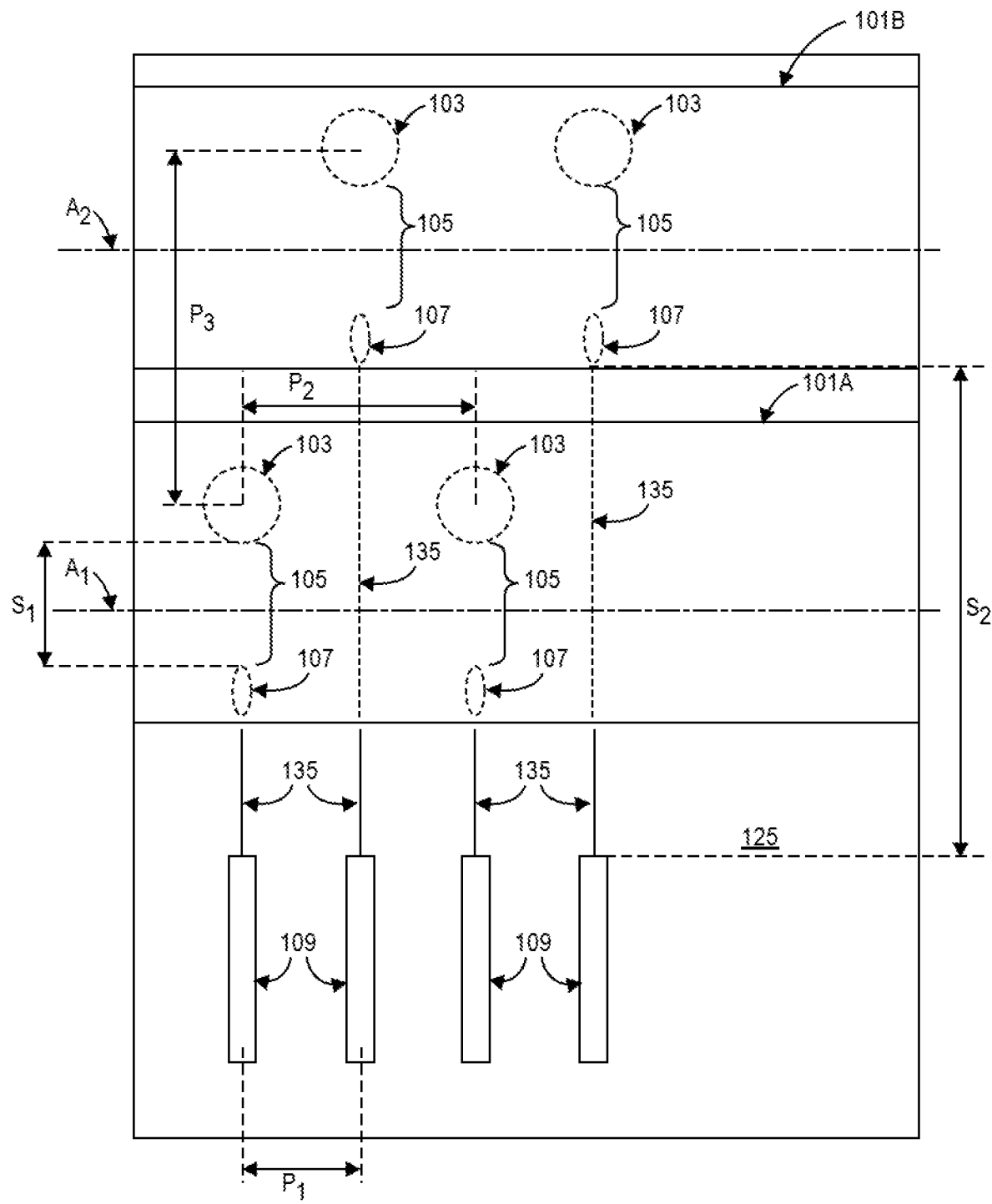
FIG. 1B is a plan view illustration of the semiconductor package shown in FIG. 1A, according to one embodiment.

Referring now to FIG. 1B, a plan view illustration of the semiconductor package shown in FIG. 1A is shown. The substrate 125 includes: (i) test pads 103; (ii) bond fingers 107 coupled to traces 135; (iii) contact pads 109 coupled to traces 135; and (iv) electrical breaks 105 between the bond fingers 107 and the test pads 103. In one embodiment, each test pad 103 is associated with a single one of the contact pads 109 and with a single one of the bond fingers 107. For brevity, the term "group" and its variations, as used herein, refer to a contact pad 109, a test pad 103, and a bond finger 107 that are associated with each together.

Each electrical break 105 associated with a group—that is, each electrical break 105 between a test pad 103 and its associated bond finger 107—has a size $S_1$. Furthermore, each electrical break 105 is adjacent to another electrical break 105 and is aligned along a common axis $A_1$, as shown in FIG. 1B. A size $S_1$ of an electrical break 105 between a test pad 103 and its associated bond finger 107 can differ from a size $S_1$ of another electrical break 105 between another test pad 103 and its associated bond finger 107, even though both electrical breaks 105 are aligned along the common axis $A_1$.

In FIG. 1B, a maximum length $S_2$ of the trace 135 is 3 millimeters (mm). Furthermore, the trace 135 can be a linear trace or a trace that comprises multiple linear segments.

A pitch $P_1$ of the contact pads 109 is equal to or less than pitches $P_2$, $P_3$ of the test pads 103. When the pitch $P_1$ of the contact pad 109 is less than the pitches $P_2$, $P_3$ of the test pads 103, the test pads 103 are fanned-out from the contact pads 109. In one embodiment, the pitch $P_1$ is less than 0.35 mm (e.g., 100 microns (μm)). In one embodiment, each of the pitches $P_2$, $P_3$ is at least 0.3 mm (e.g., 300 μm, 350 μm). In one embodiment, the pitch $P_1$ is a fine or ultra-fine pitch.

As shown in FIG. 1B, two ACFs 101A-101B are disposed on the test pads 103 and their associated bond fingers 107. In one embodiment, the ACF 101A is disposed as a single structure on test pads 103 and bond fingers 107 with electrical breaks 105 that share a common axis $A_1$. The ACF 101B is similarly positioned on the substrate 125. That is, the ACF 101B is disposed as a single structure on test pads 103 and bond fingers 107 with electrical breaks 105 that share a common axis $A_2$. In some embodiments, the axes A1 and A2 are parallel to each other.

Figure 1C:
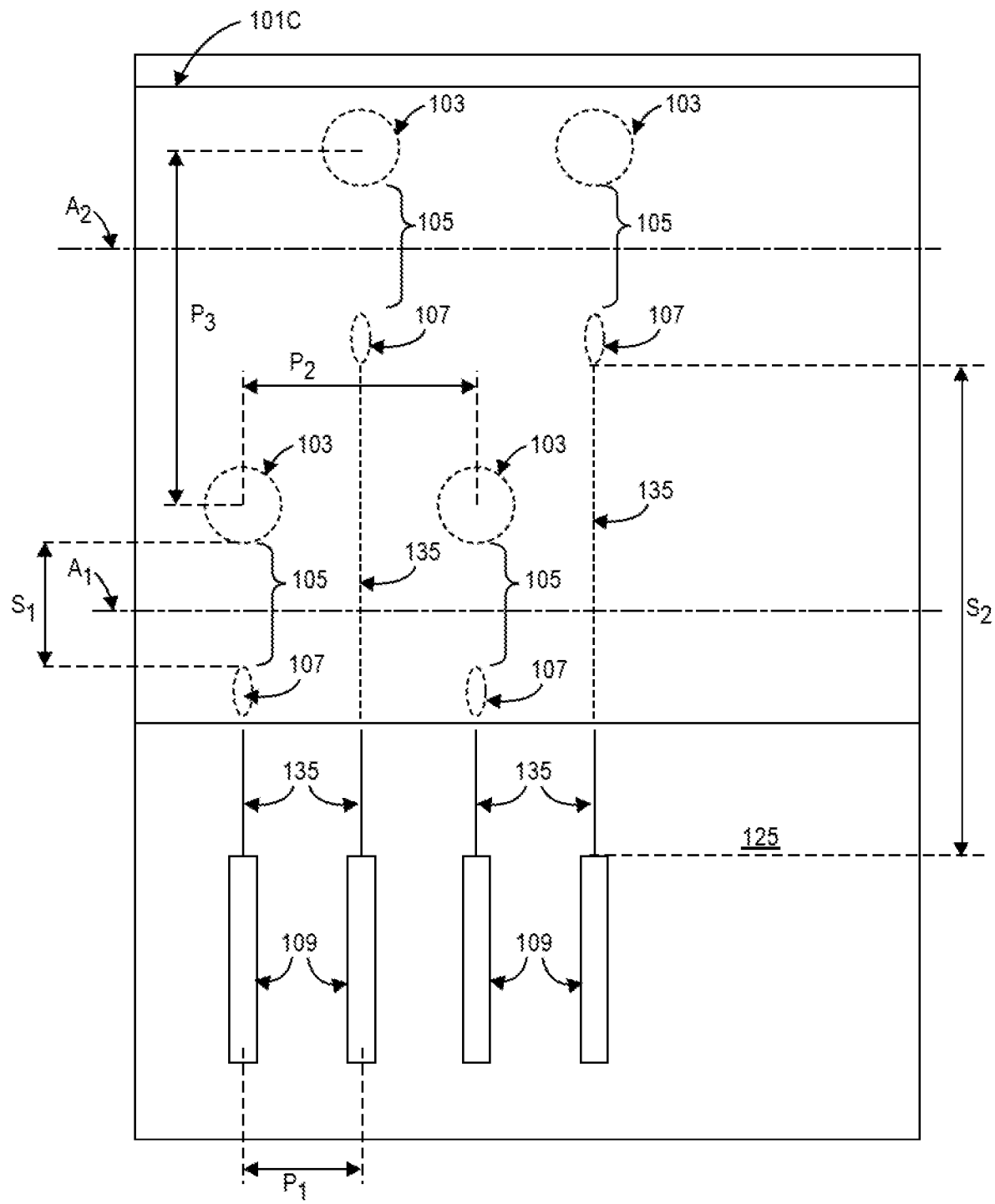
FIG. 1C is a plan view illustration of the semiconductor package shown in FIG. 1A, according to another embodiment.

Moving on to FIG. 1C, a plan view illustration of the semiconductor package in FIG. 1A is shown, according to another embodiment. The plan view shown in FIG. 1C is similar to the plan view shown in FIG. 1B, with the exception that the plan view in FIG. 1C includes a single ACF 101C positioned over all of the test pads 103, all of the bond fingers 107, and all of the electrical breaks 105 on the substrate 125. An advantage of the ACF 101C is that it can be positioned, in a single lamination operation, on the test pads 103, the bond fingers 107, and the electrical breaks 105. Despite the ACF 101C being over most of the substrate 125 (i.e., all of the test pads 103 and all of the bond fingers 107), the uncompressed ACF 101C electrically isolates all of the test pads 103 and all of the bond fingers 107 on the substrate 125 from each other. This is because the conductive particles in the ACF 101C do not create electrical paths unless they compressed. Conversely, only when a specific portion of the ACF 101C is compressed, the electrical particles in said specific portion of the ACF 101C are squeezed together. This creates a conductive path in said specific portion. In one embodiment, and as explained below in connection with FIG. 1D, compressing the ACF 101C is performed using a test pin (not shown in FIGS. 1A-1C). The test pin compresses a specific portion of the ACF 101C (i.e., a portion of the ACF 101C above a test pad 103 and a bond finger 107). Consequently, only the portion of the ACF 101C that is compressed will create an electrical path between the test pad 103 and the bond finger 107.

Figure 1D:
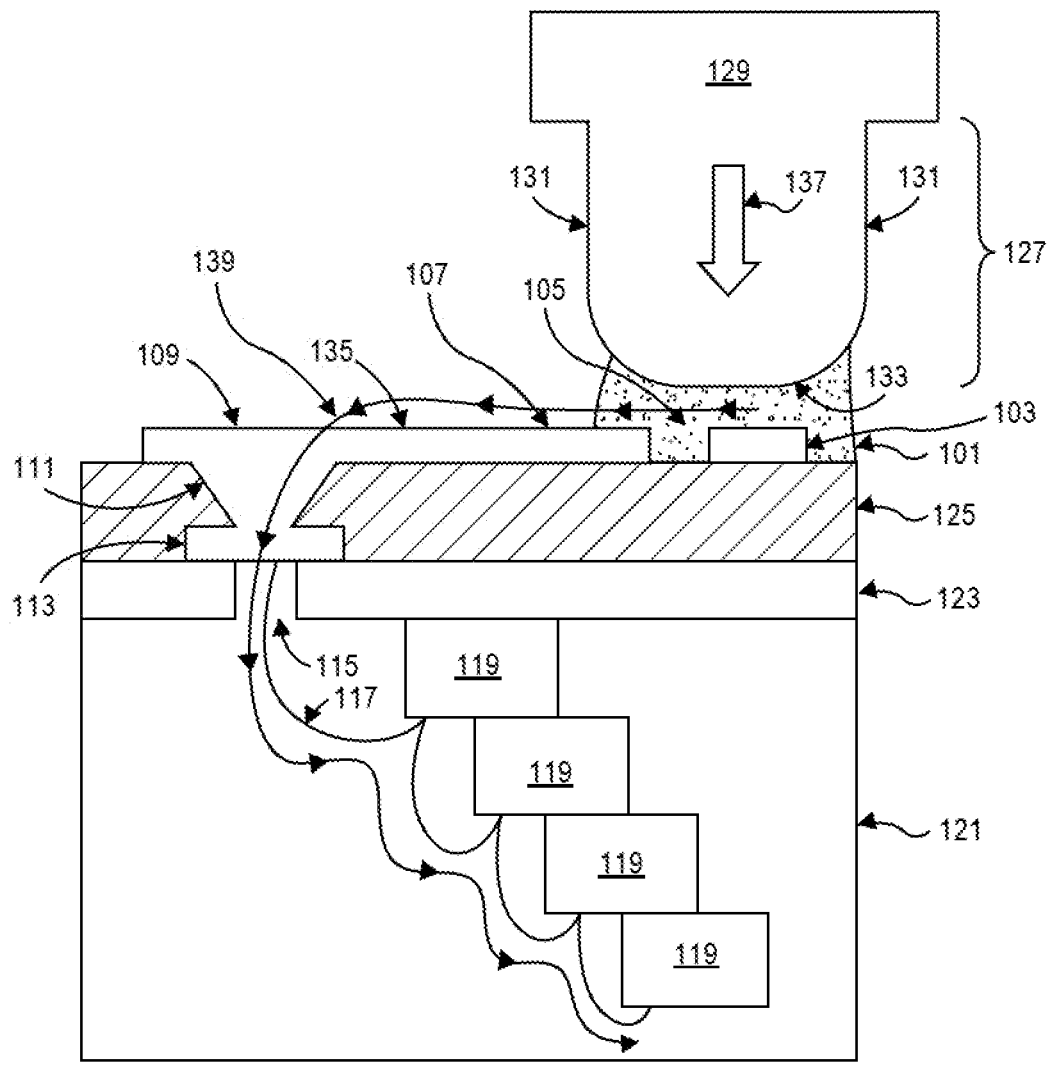
FIG. 1D is a cross sectional side view illustration of the semiconductor package shown in FIG. 1A after a test pin is used to compress the ACF, according to one embodiment.

FIG. 1D is a cross sectional side view illustration of the semiconductor package shown in FIG. 1A after a test pin 127 is used to compress the ACF 101, according to one embodiment. As shown, the test pin 127 is coupled to a test socket 129. The test socket 129 may be coupled to a test apparatus (not shown). In one embodiment, the test pin 127 is brought in contact with the ACF 101 and compresses the ACF 101. Specifically, a contact surface 133 of the test pin 127, which is coupled to the test socket 129 via sidewall surfaces 131, is used to compress the ACF 101. In this way, the conductive particles in the ACF 101 are compressed to form an electrical path that bridges the electrical break 105 between the test pad 103 and the bond finger 107. In an embodiment, a voltage 137 is applied through the test pin 127. The voltage 137 causes a current 139 to flow from the test pad 103 to the dies 119 through the bond finger 107, the trace 135, the contact pad 109, the via 111, the pad 113, and the interconnection (e.g., wire, etc.) 117. As the current 139 flows from the test pad 103 to the dies 119, the test pin can acquire data about the dies 119. The acquired data is passed to the test apparatus (not shown) that is coupled to the test socket 129. The test apparatus (not shown) uses the acquired data to determine whether the dies 119 are operating properly.

After testing is complete, the ACF 101 may be removed from the semiconductor package. Other embodiments, however, are not so limited. For example, and in one embodiment, the ACF 101 is left on semiconductor package shown in FIG. 1D after testing. Even though the ACF 101 is not removed from the semiconductor package after testing, the test pad will not function as an antenna that can causes unwanted interference during operation of the semiconductor package. This is because, when the ACF 101 is not compressed, as is the case after the test pin 127 is removed, the conductive particles of the ACF 101 will be insulated by the dielectric materials of the ACF 101 and there will be no electrical path across the electrical break 105. Consequently, the ACF 101 can assist with providing a testing technique that obviates the need to sever a conductive interconnect (e.g., a wire, a trace, etc.) between the test pad 103 and the contact pad 109 using costly and complex processes, such as laser cutting or mechanical sawing.

Another advantage of the ACF 101 is that it prevents the test pin 127 from damaging the semiconductor package (e.g., the test pad 103, the bond finger 107, etc.). In this way, yield associated with semiconductor packaging and manufacturing during testing can be increased. Yet another advantage of the ACF 101 is that it allows for testing of the dies 119 in a way that can detect manufacturing defects that cannot be detected by strip- or wafer-level testing techniques (e.g., defects that occur due to singulation, etc.).

Figure 2A:
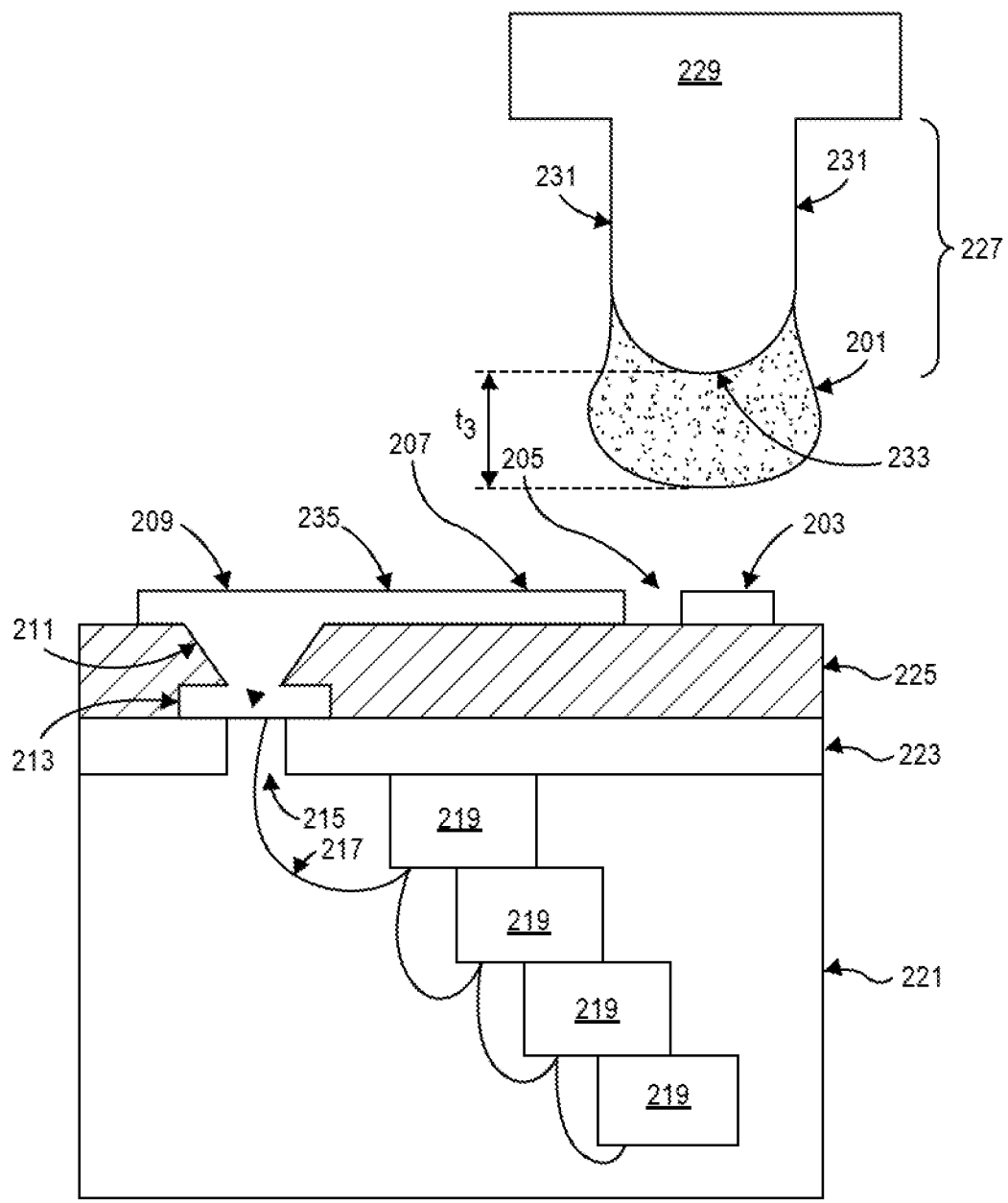
FIG. 2A is a cross sectional side view illustration of a semiconductor package and a test pin, where an ACF is positioned on the test pin and where the semiconductor package comprises an electrical break positioned between a test pad and a bond finger, according to one embodiment.

FIG. 2A is a cross sectional side view illustration of a semiconductor package and a test pin 227, where an ACF 201 is positioned on the test pin 227 and where the semiconductor package comprises an electrical break 205 positioned between a test pad 203 and a bond finger 207, according to one embodiment. The semiconductor package shown in FIG. 2A is similar to the semiconductor package shown in FIG. 1A with the exception that the ACF 201 is positioned on the test pin 227 instead of being positioned on the test pad 203 and at least one portion of the bond finger 207. Components shown in FIG. 2A that are similar to or the same as components described above in connection with FIG. 1A will not be described again unless it is necessary.

As shown in FIG. 2A, the ACF 201 is positioned on the contact surface 233 of the test pin 227 and/or sidewall surfaces 231 of the test pin 227 that are proximate to the contact surface 233 of the test pin 227. Consequently, the test pin 227, which has the ACF 201 thereon, can provide a testing technique using test pins that obviates the need to sever the conductive interconnects (e.g., a wire, a trace, etc.) between the test pad 203 and the contact pad 209 using costly and complex processes, such as laser cutting or mechanical sawing. Other advantages associated with the semiconductor package shown in FIG. 2A are similar to or the same as the advantages described above in connection with FIGS. 1A-1D. For example, the ACF 201 acts as a buffer or protective layer that prevents the contact surface 233 from damaging bond finger 207 or the test pad 203. In one embodiment, the ACF 201 has a thickness $t_3$ that is measured from the contact surface 233 of the test pin 227 to a bottom surface of the ACF 201. In one embodiment, the thickness $t_3$ ranges from 5 µm to 100 µm.

Figure 2B:
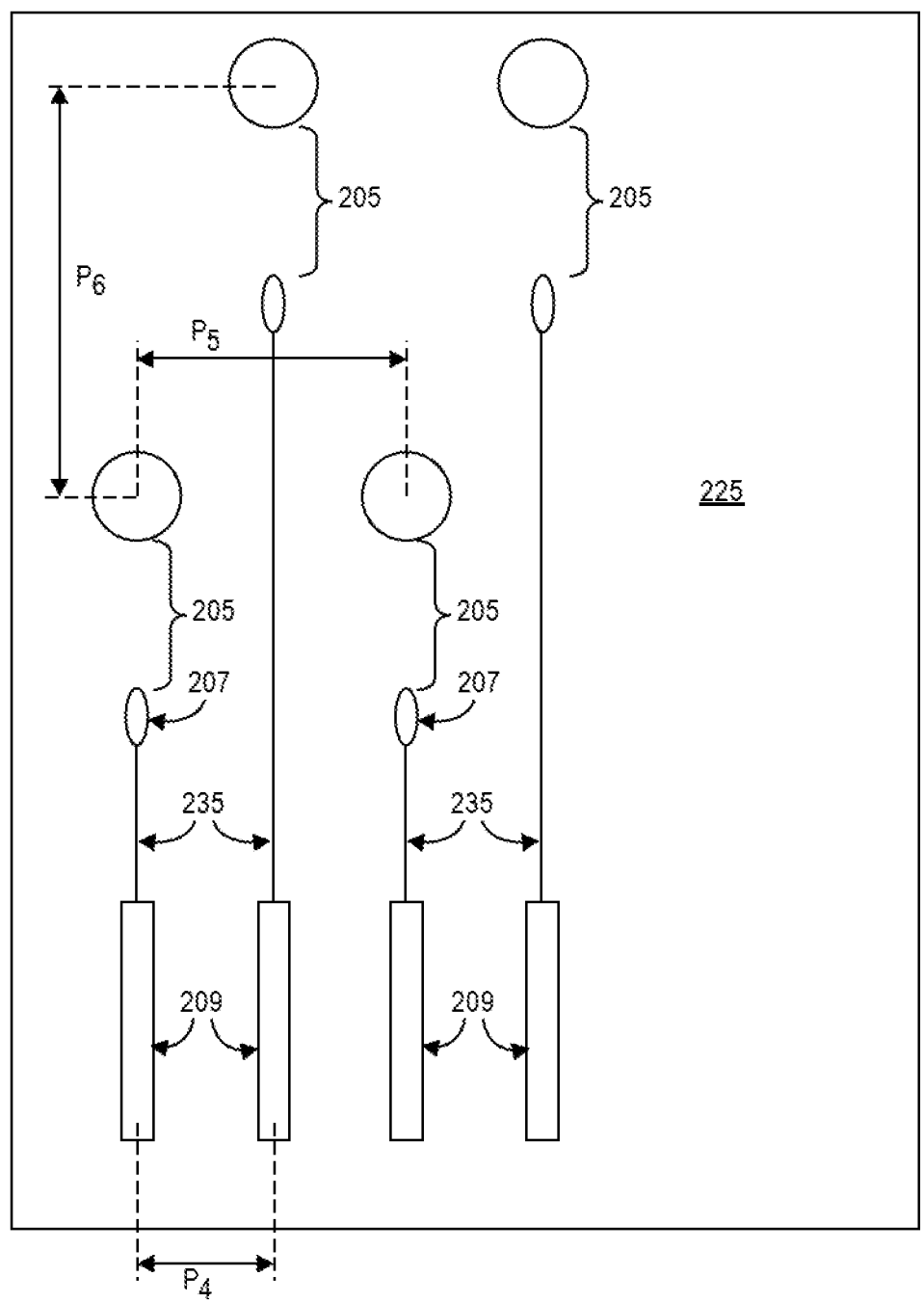
FIG. 2B is a plan view illustration of the semiconductor package shown in FIG. 2A, according to an embodiment.

FIG. 2B is a plan view illustration of the semiconductor package shown in FIG. 2A, according to an embodiment. The plan view shown in FIG. 2B is similar to or the same as the plan view shown in FIG. 1B, with the exception that an ACF is not positioned on the substrate 225. Instead, the ACF 201 (not shown in FIG. 2B) is positioned on the test pin 227 (not shown in FIG. 2B). For brevity, components and features shown in FIG. 2B that are similar to or the same as components and features described above in connection with FIG. 1B are not described again.

Figure 2C:
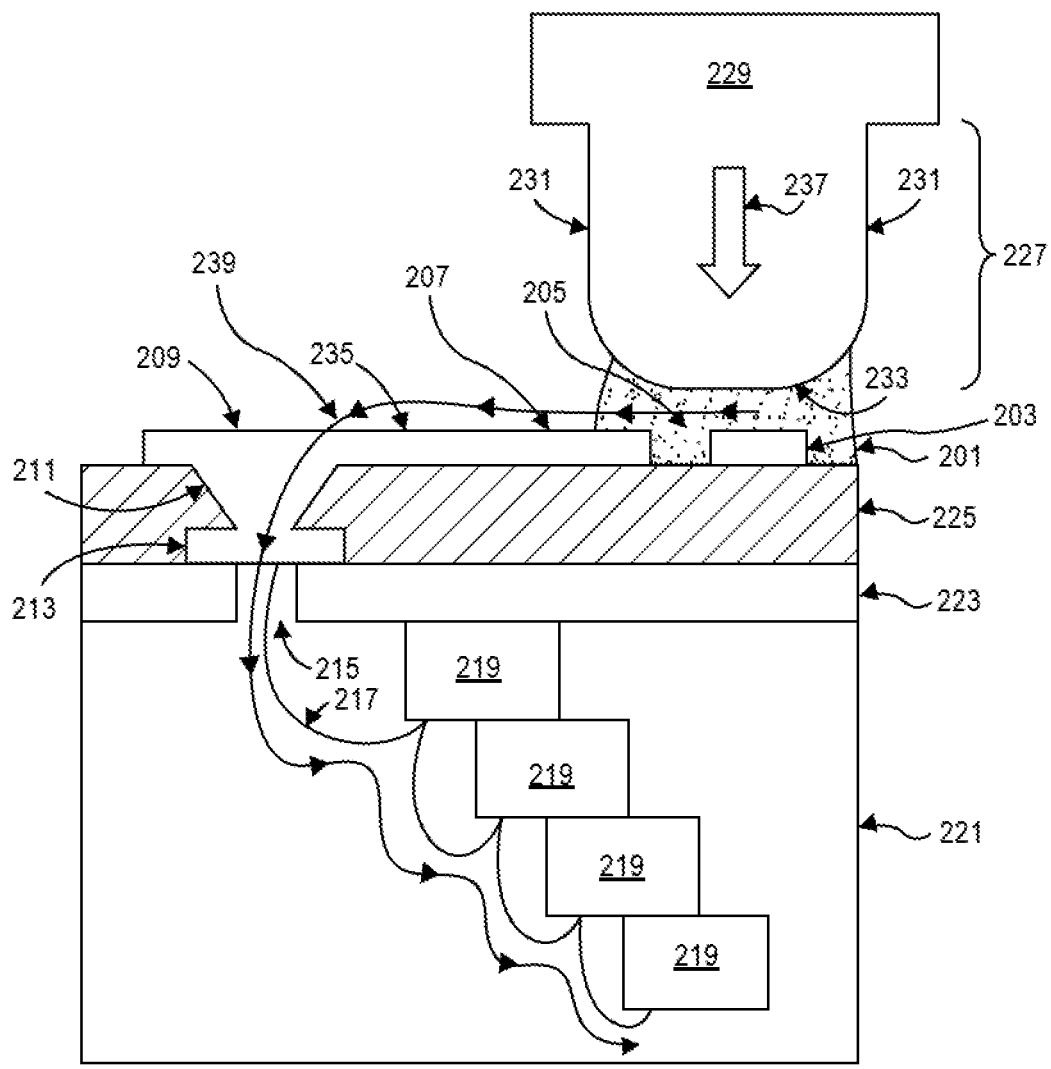
FIG. 2C is a cross sectional side view illustration of the semiconductor package shown in FIG. 2A after the ACF positioned on the test pin is positioned and compressed on the electrical break, according to one embodiment.

FIG. 2C is a cross sectional side view illustration of the semiconductor package shown in FIG. 2A after the ACF 201 positioned on the test pin 227 is positioned over and compressed on the electrical break 205, according to one embodiment. As shown, the contact surface 233 is moved in a vertical direction towards the electrical break 205, the test pad 203, and at least one portion of the bond finger 207 such that the ACF 201 is positioned over the electrical break 205, the test pad 203, and at least one portion of the bond finger 207. Next, the ACF 201 is compressed on the electrical break 205, the test pad 203, and at least one portion of the bond finger 207. This compression operation causes the conductive particles in the ACF 201 to be squeezed together to form an electrical path that bridges or replaces the electrical break 205. In this way, the test pad 203 and the bond finger 207 are electrically coupled to each other.

A voltage 237 is applied through the test pin 237 to the ACF 201 and the test pad 203. The voltage 237 causes a current 239 to flow from the test pad 203 to the dies 219 through the bond finger 207, the trace 235, the contact 209, the via 211, the pad 213, and the interconnection (e.g., wire, etc.) 217. As the current 239 flows from the test pad 203 to the dies 219, the test pin 227 can acquire data that about the dies 219. The acquired data is passed to a test apparatus (not shown) coupled to the test socket 229. The test apparatus (not shown) uses the acquired data to determine whether the dies 219 are operating properly.

After testing is complete, the ACF 201 may be removed from the test pin 227. Other embodiments, however, are not so limited. For example, and in one embodiment, the ACF 201 is left on the test pin 227 after testing and is used in the testing of subsequent devices. Once the ACF 201 has reached it useable lifespan (e.g., due to degradation, or the like), the ACF 201 may be removed from the test pin 227 and replaced with a new ACF 201. Regardless of whether the ACF 201 is removed from the test pin 227, the test pad 203 will not function as an antenna that can causes unwanted interference during operation of the semiconductor package given that there is no longer a conductive bridge across the electrical break 205 when the test pin 227 and the ACF 201 thereon are removed. Such a testing technique obviates the need to sever the conductive interconnects (e.g., a wire, a trace, etc.) between the test pad 203 and the contact pad 209 using costly and complex processes, such as laser cutting or mechanical sawing.

Another advantage of the ACF 201 is that it prevents the test pin 227 from damaging the semiconductor package (e.g., the test pad 203, the bond finger 207, etc.). In this way, yield associated with semiconductor packaging and manufacturing during testing can be increased. Yet another advantage of the ACF 201 is that it allows for testing of the dies 219 in a way that can detect manufacturing defects that cannot be detected by strip- or wafer-level testing techniques (e.g., defects attributable to singulation of semiconductor packages from a strip or wafer, etc.).

FIGS. 3A-3D are cross sectional side view illustrations of test pins 307A-307D, according to several embodiments. With regard now to FIG. 3A, a test pin 307A extending from a test socket 301A is shown. The test socket 301A may be coupled to a test apparatus (not shown in FIG. 3A). The test pin 307A comprises a contact surface 305A opposite the test socket 301A. The contact surface 305A is coupled to the test socket 301A by sidewall surfaces 303A of the test pin 307A. In one embodiment, the contact surface 305A has a curved profile.

Moving on to FIG. 3B, a test pin 307B extending from a test socket 301B is shown. The test socket 301B may be coupled to a test apparatus (not shown in FIG. 3B). The test pin 307B comprises a contact surface 305B opposite the test socket 301B. The contact surface 305B is coupled to the test socket 301B by sidewall surfaces 303B of the test pin 307B. In one embodiment, the contact surface 305B is pointed. That is, portions of the sidewall surfaces 303B proximate to the contact surface 305B are tapered.

Referring now to FIG. 3C, a test pin 307C extending from a test socket 301C is shown. The test socket 301C may be coupled to a test apparatus (not shown in FIG. 3C). The test pin 307C comprises a contact surface 305C opposite the test socket 301C. The contact surface 305C is coupled to the test socket 301C by sidewall surfaces 303C of the test pin 307C. In one embodiment, the contact surface 305C is substantially perpendicular (e.g., orthogonal, etc.) to the sidewall surfaces 303C proximate to the contact surface 305C.

Figure 3D:
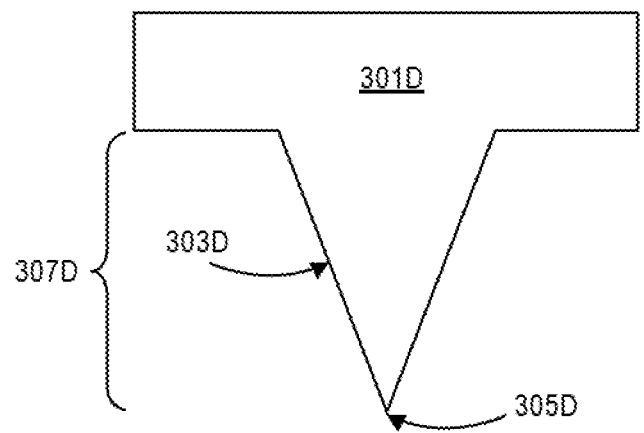

Referring now to FIG. 3D, a test pin 307D extending from a test socket 301D is shown. The test socket 301D may be coupled to a test apparatus (not shown in FIG. 3D). The test pin 307D comprises a contact surface 305D opposite the test socket 301D. The contact surface 305D is coupled to the test socket 301D by sidewall surfaces 303D of the test pin 307D. In one embodiment, the contact surface 305D is pointed because the sidewall surfaces 303D are tapered.

Figure 4:
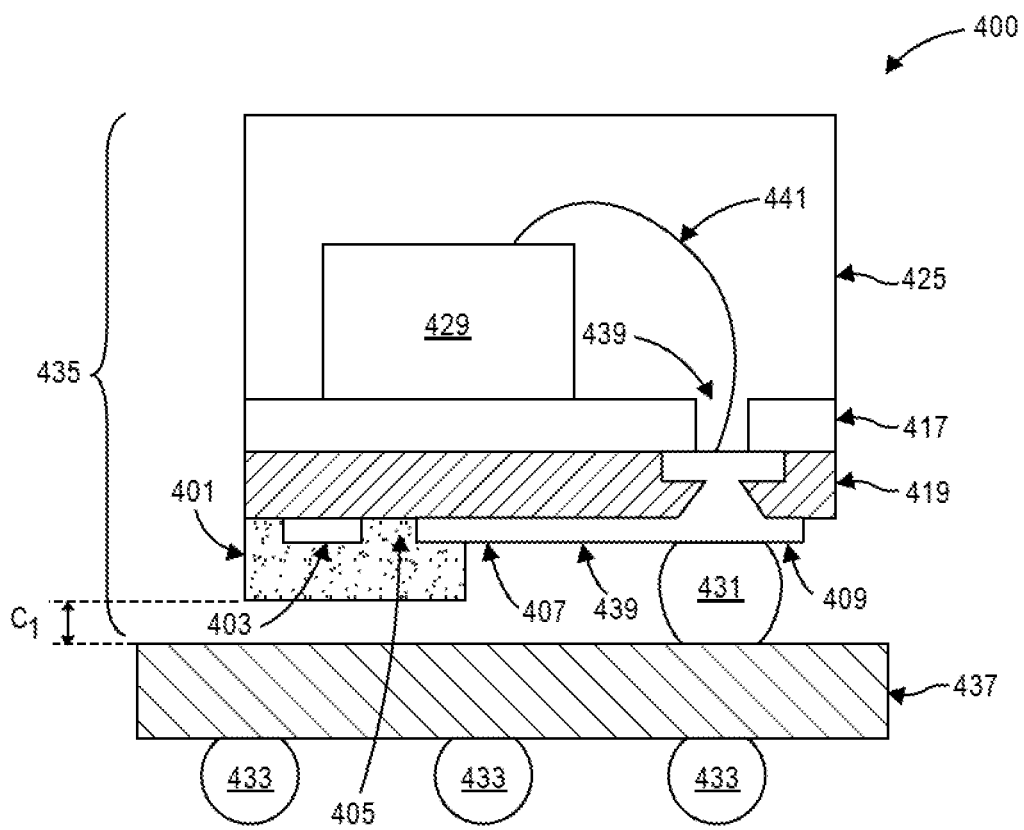
FIG. 4 is a cross sectional side view illustration of packaged system that comprises a semiconductor package, where the semiconductor package comprises an ACF over an electrical break positioned between a test pad and a bond finger, according to one embodiment.

FIG. 4 is a cross sectional side view illustration of packaged system 400 that comprises a semiconductor package 435, where the semiconductor package 435 comprises an ACF 401 over an electrical break 405 positioned between a test pad 403 and a bond finger 407, according to one embodiment. The packaged system 400 may include a semiconductor package 435 that comprises an ACF 401, one or more dies 429, a contact pad 409, a test pad 403, a trace 439, a substrate 419, a bond finger 407, a solder resist layer 417, an SRO 439, an interconnection (e.g., wire, etc.) 441, and a molding compound 425. In one embodiment, the semiconductor package 435 is similar to or the same as any one of the semiconductor packages described above in connection with FIGS. 1A-2D. For example, the semiconductor package 435 may include a conductive path that has an electrical break 405 between the bond finger 407 and the test pad 403.

The semiconductor package 435 can be coupled to a board (e.g., a printed circuit board (PCB), etc.) 437 using interconnects 431, which may be formed from solder, copper, or any other suitable material or combination of materials known in the art. Examples of interconnects 431 include, but are not limited to, solder bumps, micro bumps, and pillars. The semiconductor package 435 may be supported on the board by support structures (not shown in the FIG. 4).

In one embodiment, a clearance distance $C_1$ is provided between the ACF 401 and the board 437. This clearance distance $C_1$ prevents the ACF 401 from being compressed by the board 437. When the ACF 401 is compressed, the conductive properties of the ACF 401 are activated, the electrical break 405 is bridged or replaced, and the test pad 403 is electrically coupled to the contact pad 409. This inadvertent coupling can create problems that affect the proper operation of the semiconductor package 435. For example, the inadvertent coupling may cause the test pad 403 to function as an antenna that produces unwanted interference during operation of the semiconductor package 435.

In some embodiments, the board 437 may be an intermediate board, an interposer, or the like. That is, the board 437 may be coupled to another component. In such embodiments, the board 437 may have interconnects 433 positioned thereon, which may be formed from solder, copper, or any other suitable conductive material or combination of conductive materials known in the art. Examples of interconnects 433 include, but are not limited to, solder bumps, micro bumps, and pillars.

FIG. 5 illustrates a schematic of computer system 500 according to an embodiment. The computer system 500 (also referred to as an electronic system 500) can include a semiconductor package that has been tested using an ACF that has been designed in accordance with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package. In one embodiment, the integrated circuit 510 or the processor 512 is tested using an ACF that is designed in accordance with any of the embodiments and their equivalents, as described in the foregoing specification. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM). In one embodiment, the on-die memory 516 may be packaged with a suitable packaging process. In one embodiment, subsequent to packaging, the on-die memory 516 is tested using an ACF that is designed in accordance with any of the embodiments and their equivalents, as described in the foregoing specification.

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also include embedded memory 548 such as the first die in a die stack, according to an embodiment. In one embodiment, subsequent to packaging, the embedded memory 548 is tested using an ACF that is designed in accordance with any of the embodiments and their equivalents, as described in the foregoing specification.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

At least one of the integrated circuits 510 or 511 can be implemented in a number of different embodiments, including a semiconductor package, an electronic system, a computer system, one or more methods of fabricating an integrated circuit, and one or more methods of fabricating a semiconductor package. In one embodiment, subsequent to packaging, at least one of the integrated circuits is tested using an ACF that is designed according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate. A foundation substrate may be included, as represented by the dashed line of FIG. 5. Passive devices may also be included, as is also depicted in FIG. 5.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein include a semiconductor package, comprising: a die stack comprising one or more dies; a molding compound encapsulating the die stack; a substrate on the molding compound; a contact pad on a surface of the substrate and coupled to the die stack; a test pad on the surface of the substrate; a conductive path between the contact pad and the test pad, wherein an electrical break is positioned along the conductive path; and an anisotropic conductive film (ACF) over the electrical break.

Additional embodiments include a semiconductor package, further comprising: a bond finger on the surface of the substrate between the contact pad and the test pad, the bond finger being closer to the test pad than the contact pad, wherein the conductive path between the contact pad and the test pad comprises the bond finger and wherein the electrical break is positioned between the bond finger and the test pad along the conductive path.

Additional embodiments include a semiconductor package, wherein a thickness of the ACF ranges from 5 micrometers (μm) to 100 μm.

Additional embodiments include a semiconductor package, wherein the test pad comprises a first surface, a second surface in contact with the substrate, and sidewall surfaces coupling the first surface of the test pad to the second surface of the test pad, and wherein the ACF is over the first surface and sidewall surfaces of the test pad.

Additional embodiments include a semiconductor package, wherein the conductive path further comprises a trace that couples the contact pad and the bond finger to each other.

Additional embodiments include a semiconductor package, wherein a maximum length of the trace is 3 millimeters.

Additional embodiments include a semiconductor package, wherein the bond finger terminates at the electrical break.

Additional embodiments include a semiconductor package, wherein the ACF bridges the electrical break and extends over the test pad and the bond finger.

Additional embodiments include a semiconductor package, wherein at least one portion of the ACF is on the substrate.

Additional embodiments include a semiconductor package, wherein the ACF is over and around at least one portion of the bond finger.

Embodiments described herein include a method, comprising: providing a semiconductor package, the semiconductor package comprising: a die stack comprising one or more dies; a molding compound encapsulating the die stack; a substrate on the molding compound; a contact pad on a surface of the substrate and coupled to the die stack; a test pad on the surface of the substrate; a conductive path between the contact pad and the test pad, wherein an electrical break is positioned along the conductive path; and an anisotropic conductive film (ACF) over the electrical break; and compressing the ACF with a test pin extending from a test socket, wherein the compressed ACF provides an electrical path across the electrical break.

Additional embodiments include a method, wherein the semiconductor package further comprises a bond finger on the surface of the substrate between the contact pad and the test pad, the bond finger being closer to the test pad than the contact pad, wherein the conductive path between the contact pad and the test pad comprises the bond finger, and wherein the electrical break is positioned between the bond finger and the test pad along the conductive path.

Additional embodiments include a method, further comprising: applying, by the test pin, a voltage to the test pad, the voltage causing a current to flow from the test pad to the one or more devices through the bond finger and the contact pad; acquiring, by the test pin, data from the test pad; and transmitting the acquired data, via the test pin, to a testing apparatus coupled to the test socket.

Additional embodiments include a method, further comprising: attaching the ACF to the test pad and the bond finger.

Additional embodiments include a method, further comprising: attaching the ACF to the test pin.

Embodiments described herein include a semiconductor package, comprising: a die stack comprising one or more dies; a molding compound encapsulating the die stack; a substrate on the molding compound; a plurality of contact pads on a surface of the substrate and coupled to the die stack; a plurality of test pads on the surface of the substrate, wherein each test pad is paired with a single contact pad; a plurality of conductive paths between the plurality of contact pads and the plurality of test pads, wherein each conductive path is between a test pad and a contact pad and wherein an electrical break is positioned along each conductive path; and an anisotropic conductive film (ACF) across each electrical break.

Additional embodiments include a semiconductor package, wherein a pitch associated with the plurality of test pads is greater than a pitch associated with the plurality of contact pads.

Additional embodiments include a semiconductor package, further comprising a plurality of bond fingers on the surface of the substrate, wherein each bond finger is closer to a test pad than a contact pad, wherein each bond finger is associated with a single test pad, and wherein each bond finger terminates at an electrical break.

Additional embodiments include a semiconductor package, wherein the ACF is over all electrical breaks on the substrate.

Additional embodiments include a semiconductor package, wherein the ACF is over all test pads and all bond fingers on the substrate.

Additional embodiments include a semiconductor package, wherein the ACF is over a plurality of electrical breaks on the substrate, and wherein each of the plurality of electrical breaks is aligned along an axis.

Additional embodiments include a semiconductor package, wherein a second ACF is over a second plurality of electrical breaks on the substrate, wherein each of the second plurality of electrical breaks is aligned along a second axis, and wherein the first axis differs from the second axis.

Additional embodiments include a semiconductor package, wherein the first axis is parallel to the second axis.

Embodiments described herein include a test socket, comprising: a test pin extending from the test socket, the test pin comprising: a contact surface opposite the test socket; sidewall surfaces coupling the contact surface and the test socket to each other; and an anisotropic conductive film (ACF) positioned on the test pin.

Additional embodiments include a test socket, wherein the ACF is on one or more of: (i) the contact surface; and (ii) portions of the sidewall surfaces proximate to the contact surface.

The invention claimed is:

1. A semiconductor package, comprising:
    a die stack comprising one or more dies;
    a molding compound encapsulating the die stack;
    a substrate on the molding compound;
    a contact pad on a surface of the substrate and coupled to the die stack;
    a test pad on the surface of the substrate;
    a path between the contact pad and the test pad, wherein the path comprises a first conductive portion and a second conductive portion, and an electrical break between the first conductive portion and the second conductive portion; and
    an anisotropic conductive film (ACF) over the electrical break.

2. The semiconductor package of claim 1, further comprising:
    a bond finger on the surface of the substrate between the contact pad and the test pad, the bond finger being closer to the test pad than the contact pad, wherein the path between the contact pad and the test pad comprises the bond finger and wherein the electrical break is positioned between the bond finger and the test pad along the path.

3. The semiconductor package of claim 1, wherein a thickness of the ACF ranges from 5 micrometers (μm) to 100 μm.

4. The semiconductor package of claim 3,
    wherein the test pad comprises a first surface, a second surface in contact with the substrate, and sidewall surfaces coupling the first surface of the test pad to the second surface of the test pad, and
    wherein the ACF is over the first surface and sidewall surfaces of the test pad.

5. The semiconductor package of claim 2, wherein the path further comprises a trace that couples the contact pad and the bond finger to each other.

6. The semiconductor package of claim 5, wherein a maximum length of the trace is 3 millimeters.

7. The semiconductor package of claim 5, wherein the bond finger terminates at the electrical break.

8. The semiconductor package of claim 7, wherein the ACF bridges the electrical break and extends over the test pad and the bond finger.

9. The semiconductor package of claim 7, wherein at least one portion of the ACF is on the substrate.

10. The semiconductor package of claim 9, wherein the ACF is over and around at least one portion of the bond finger.

11. A semiconductor package, comprising:
a die stack comprising one or more dies;
a molding compound encapsulating the die stack;
a substrate on the molding compound;
a plurality of contact pads on a surface of the substrate and coupled to the die stack;
a plurality of test pads on the surface of the substrate, wherein each test pad is paired with a single contact pad;
a plurality of paths between the plurality of contact pads and the plurality of test pads, wherein each path is between a test pad and a contact pad and wherein each path comprises a first conductive portion and a second conductive portion, and an electrical break between the first conductive portion and the second conductive portion; and
an anisotropic conductive film (ACF) across each electrical break.

12. The semiconductor package of claim 11, wherein a first pitch of the plurality of test pads is greater than a second pitch of the plurality of contact pads.

13. The semiconductor package of claim 11, further comprising a plurality of bond fingers on the surface of the substrate, wherein each bond finger is closer to a test pad than a contact pad, wherein each bond finger is associated with a single test pad, and wherein each bond finger terminates at a corresponding one of the electrical breaks.

14. The semiconductor package of claim 13, wherein the ACF is over the electrical break in each path.

15. The semiconductor package of claim 14, wherein the ACF is over all of the test pads and all of the bond fingers on the substrate.

16. The semiconductor package of claim 13,
wherein the ACF is over a first plurality of the electrical breaks on the substrate, and
wherein each of the first plurality of the electrical breaks is aligned along an axis, the axis a longitudinal axis of a corresponding one of the bond fingers.

17. The semiconductor package of claim 16,
wherein a second ACF is over a second plurality of the electrical breaks on the substrate,
wherein each of the second plurality of the electrical breaks is aligned along a second axis, and
wherein the axis differs from the second axis.

18. The semiconductor package of claim 17, wherein the axis is parallel to the second axis.

* * * * *